United States Patent [19]

Paquin et al.

[11] Patent Number: 5,335,106

[45] Date of Patent: Aug. 2, 1994

[54] OPTICALLY-BASED FREQUENCY SYNTHESIZER FOR GENERATING AN ELECTRIC OUTPUT SIGNAL AT A PRESELECTED FREQUENCY THAT CAN BE CHANGED OVER A WIDE BAND OF FREQUENCIES FOR COMMUNICATION PURPOSE

[75] Inventors: Normand Paquin, Westmount; A. K. Ghosh, Dollard des Ormeaux, both of Canada

[73] Assignee: MPB Technologies Inc., Quebec, Canada

[21] Appl. No.: 969,455

[22] Filed: Oct. 30, 1992

[51] Int. Cl.$^5$ .............................................. H04B 10/06
[52] U.S. Cl. .................................... 359/180; 359/181; 359/191; 359/326
[58] Field of Search ............... 359/162, 161, 191, 193, 359/194, 180, 181, 182, 183, 326

[56] References Cited

U.S. PATENT DOCUMENTS

| | | | |
|---|---|---|---|
| 4,042,891 | 8/1977 | Levine | 331/1 |
| 4,335,463 | 6/1982 | Foucard | 375/1 |
| 4,818,064 | 4/1989 | Youngquist et al. | 359/127 |
| 4,856,899 | 8/1989 | Iwaoka et al. | 356/346 |
| 4,912,526 | 3/1990 | Iwaoka et al. | 359/181 |

OTHER PUBLICATIONS

"Simple Technique for Improving the Resolution of the Delayed Self-Heterodyne Method", Optics Letters, vol. 15, No. 11, Jun. 1, 1990-Hidemi Tsuchida.

Primary Examiner—Richard E. Chilcot, Jr.
Assistant Examiner—Rafael Bacares
Attorney, Agent, or Firm—Michael D. Bednarek

[57] ABSTRACT

The optically-based frequency synthesizer for generating an electric output signal at a preselected frequency having a given period that can be changed over a wide band of frequencies for communication purposes, comprises a modulator having an input for receiving a command signal, and an output for generating a current driving signal having a DC component, and a modulating component formed of an AC signal having a predetermined time period which is an integer multiple of the period of the preselected frequency, and an amplitude responsive to the command signal, a laser having an input for receiving the current driving signal, the coherent light signal having a given coherence time; optical isolators for receiving the light signal emitted by said laser; a splitter having an input optically connected to the isolators; a first optical path having an end optically connected to the splitter; and a second optical path having an end optically connected to the splitter, and a delay means along its length, the time delay being shorter than the coherence time. The synthesizer also comprises a recombiner having first and second inputs optically connected to the paths respectively; and a non-linear device having an input optically connected to an output of the recombiner, and an output for generating the electric output signal at the preselected frequency.

20 Claims, 6 Drawing Sheets

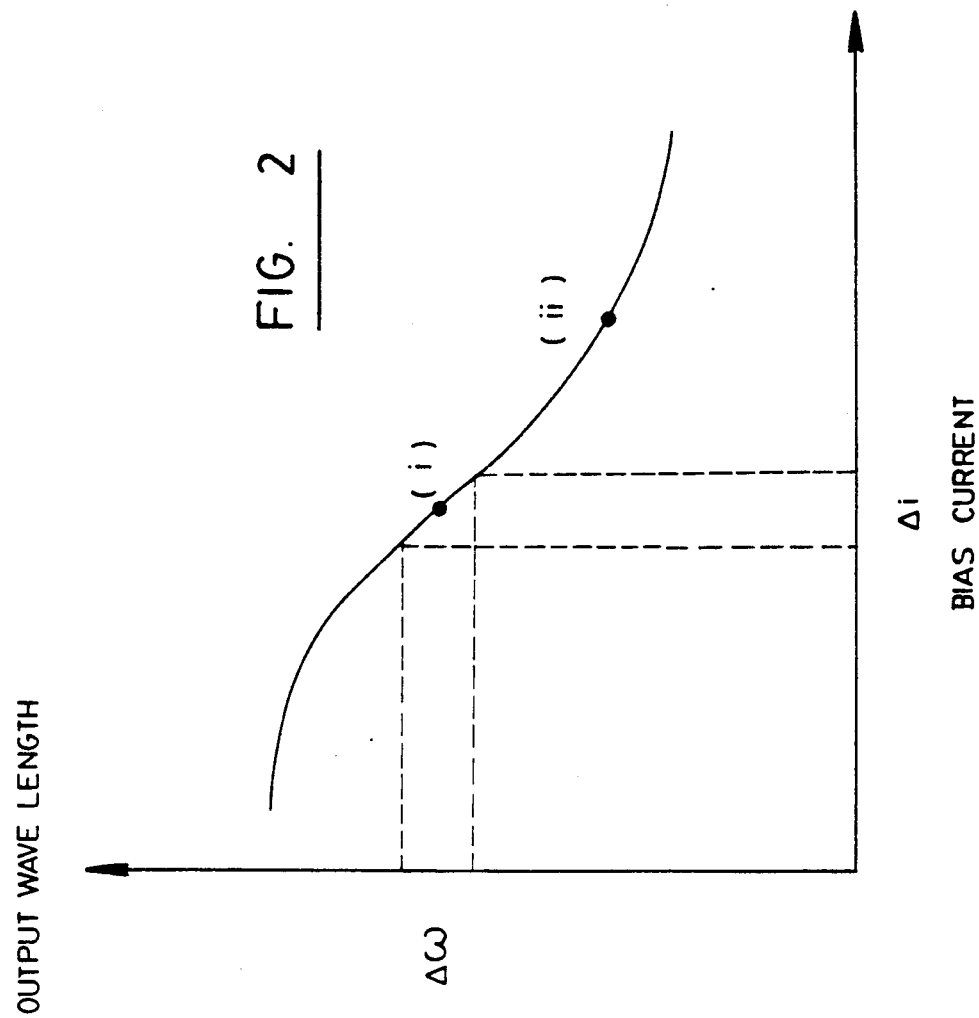

OPTICALLY-BASED FREQUENCY SYNTHESIZER FOR GENERATING AN ELECTRIC OUTPUT SIGNAL AT A PRESELECTED FREQUENCY THAT CAN BE CHANGED OVER A WIDE BAND OF FREQUENCIES FOR COMMUNICATION PURPOSE

BACKGROUND OF THE INVENTION

The present invention relates to an optically-based frequency synthesizer for generating an electric output signal at a preselected frequency that can be changed over a wide band of frequencies for communication purposes. The present invention is also concerned with a method thereof.

Known in the art, there is the publication entitled "Simple Technique for Improving the Resolution of the Delayed Self-Heterodyne Method" published in Optics Letters/vol. 15, no. 11/Jun. 1, 1990, at p. 640, where FIG. 1 shows a typical delayed self-heterodyne set-up. Note that the laser is not modulated. The output frequency is equal to the input frequency $\omega_s$. The delay time is also much larger than the coherence time of the laser.

Also known in the art, there is the publication entitled "Linewidth Determination from Self-Heterodyne Measurements with Subcoherence Delay Times" published in IEEE Journal of Quantum Electronics, vol. QE-22, no. 11, November 1986, p.2070-2074. The delay self-heterodyne linewidth measurement technique proposed before this paper normally requires that the delay time be much greater than the coherence time. This paper shows that complex curve fitting can be used for subcoherence analysis. Note that the laser is not modulated in any way. The output beat frequency is simply the input frequency injected by the acoustical-optic modulator. This cannot be used as a frequency synthesizer since the output frequency generated requires an input of the very same frequency.

Also known in the art, there is the publication entitled "Measurement of a Modulated DFB Laser Spectrum Using Gate Delayed Self-Homodyne Technique" published in Electronics Letters, vol. 24, no. 11, 1988 at p.699. In the apparatus shown in FIG. 1 of this publication, the time delay T is set to be much greater than the coherence time to eliminate linewidth reduction and coherence effects. This is seen as problem while the linewidth reduction through the use of a short time delay is seen as a key factor for the success of the present invention. Large modulation factors are used in this paper to generate chirp effects while the present invention will seek to avoid these.

Also known in the art there is the publication entitled "35 GHz Microwave Signal Generation with an Injection-Locked Laser Diode" published in Electronics Letters, Aug. 29, 1985, vol. 21, no. 18, where two modes of a slave laser are excited optically by a master laser. A very narrow linewidth results at the PIN detector at this RF frequency from the beating of the two modes. To function, this operation between the slave modes must be thermally adjusted to match the RF modulation of the master laser. This is a very slow process which eliminates the system for fast hopping frequency synthesizers.

Also known in the art, there is the publication entitled "Miniature Packaged External-Cavity Semiconductor Laser with 50 GHz Continuous Electrical Tuning Range" published in Electronics Letters, vol. 24, no. 16, 1988 at p.988, where an external cavity is used to obtain a narrow linewidth laser output. The adjustment is mechanical, therefore inherently slow. No scheme is set up to get a beat frequency in the RF band.

Also known in the art, there is the U.S. Pat. No. 4,042,891 granted on Aug. 16, 1977 and naming Arnold M. Levine as the inventor. This patent describes a frequency synthesizer or programmable multiple frequency source which uses a voltage-controlled oscillator responsive to an independent control variable and incorporates a fibre optic delay line in an error correcting feedback loop.

Also known in the art, there is the U.S. Pat. No. 4,856,899, granted on Aug. 15, 1989, and naming Hideto Iwaoka et al. as inventors. This patent describes an optical frequency analyzer for measuring an optical frequency spectrum with high accuracy, high resolving power and high stability by heterodyne detecting the incident light with the aid of a local oscillator. This patent does not show the necessary means for generating an electric output signal at a preselected frequency that can be changed over a wide band of frequencies.

Also known in the art, there is the U.S. Pat. No. 4,335,463 granted on Jun. 15, 1982 and naming Joseph Foucard as the inventor. In this patent, there is described a spectrum spread transmission system, particularly adapted for telephone network and using optical fibers. Also, this patent does not show the necessary means for providing an optically-based frequency synthesizer.

The art of frequency synthesis is very old. Many developments have occurred in this field, leading to many types of frequency synthesizers. A good review of these synthesizers, their operating principles and limitations can be found in "Frequency Synthesizers Theory and Design", second edition, written by V. Manassewitsch and published by John-Wiley & Sons in Toronto, 1980. The following reviews briefly the prior art.

In order to compare various methods for frequency synthesis, it is useful to identify parameters of importance when making a comparison.

In a system based on fast hopping frequency synthesis, perhaps to minimize the probability of intercept or the possibility of jamming, it is advantageous to operate over the largest possible hopping bandwidth. To understand this, one can think of a situation where a narrow communication signal could be sent at any frequency over a wide band. To simply try to jam such a signal by blanketing the entire band is prohibitive in terms of power requirements. To try to find the signal and to lock into it and intercept it before the frequency of the signal is "hopped" to a different point is also more difficult, the larger the frequency hopping band. In currently available electronically based systems, the hopping bandwidth available is typically in the order of ten to twenty percent of the operating center frequency.

The availability of frequency bands for communications at "low" frequencies is becoming more and more restrictive. This is part of the reason for the growing need to develop communications systems operating in microwave and millimeterwave frequency bands found in the 17 to 100 GHz range. There are other advantages for operating at higher frequencies such as the fact that higher frequency beams can be made very narrow and directional and thus be more difficult to intercept. In addition, systems operating at higher frequencies generally tend to be more compact, which is a distinct advantage for mobile, battlefield or space requirements. However, operation at higher frequency bands impose difficult manufacturing requirements for synthesizers based on electronic methods. Electronic components must be made to a reduced scale which requires the use of sophisticated and expensive integrated circuits based on MMIC technology (Monolithic Microwave Integrated Circuits) or hybrid technology. Modelling of these conventionally based technologies is difficult if not unreliable. Reliability and reproducibility problems occur, especially with respect to the manufacturing of the components in the foundry and the integration of these components. We also note that conventional methods for "low" frequency operation used for television systems, for example, are totally inadequate. The optical technique in the proposed invention is not limited by such considerations. All the electronics required to govern the optically-based frequency synthesis operate at modest frequencies in the order of the inverse delay time (MHz's) in the delay line of the optical paths. Only the output amplification stage of a synthesizer need be wideband.

Another critical aspect of a fast hopping frequency synthesizer is how fast it can hop from one frequency to the next. This limits the time available for an intercept receiver to find and lock on to the signal. In conventional systems, an important fundamental limit restricts this switching speed. This physical limit is based on the fact that the time for a signal to decay or rise through a filter is inversely proportional to its bandwidth. Filters are required in conventional systems because they are based on mixing and multiplying stages to get to the final desired frequencies. These stages generate unwanted spurs and harmonics which must be filtered out to meet communication requirements. The fastest electronic synthesizers are DDS (discussed below) which have switching speeds in the order of 10 nsec. However, these synthesizers generate high levels of spurious noise and require frequency up-conversion to be used in high frequency wideband communication link.

Phase noise provides a measure of the quality and purity of the signal generated by the frequency synthesizer. The better the phase noise of a synthesizer, the lower will be the bit error rate in communications for a given rate signal power. In addition, the lower the phase noise is, the narrower will be the linewidth of the synthesized signal. This also reduces the power requirements on the synthesized output. The invention proposed makes key use of the coherent properties of lasers to obtain coherent noise cancellation. This noise cancellation provides linewidth reduction in the output to the point that the output can be used for communication purposes. This is a critical aspect of this invention: simply heterodyning two lasers for example results in a totally incoherent interaction between the laser outputs. The resulting linewidth of the output will be typically in the order of 50 to 200 MHz for semiconductor lasers, which is totally inappropriate for most communication purposes.

The volume occupied by a frequency synthesizer, its weight, and power requirements are also important factors for frequency synthesizer. This is especially true for space-bound systems as for mobile platforms, and to a lesser degree, for fixed earth stations.

Another important parameter, especially for a space, or military application, is the number of parts in a complete system. This affects the overall reliability of the system, the cost of assembly and maintenance, and in the case of high frequency electronic systems, increases the difficulties in achieving an acceptable level of reproducibility and yield from production. Most approaches that have sought to introduce optical devices as substitutes for microwave or millimeterwave components have maintained approximately the same overall design configuration and thus have not reduced the total parts count significantly.

A frequency synthesizer is a system that results in the generation of one or more frequencies from one or a few reference sources. The earliest version was probably a crystal controlled oscillator with a bank of crystals switched in manually. Very few frequencies could be generated by such a system. The next improvement to the art was to develop the concept of incoherent synthesis where a number of crystal-controlled oscillators were combined to generate many frequencies with relatively few crystals, Evolving communication requirements led to the development of coherent frequency synthesis. This form of the art provided orders of magnitude improvements in accuracy and stability. Coherent synthesis provides means by which many frequencies are produced from a single reference source. Coherent direct synthesis is limited by the generation of spurious outputs and the large number of stages and parts required to achieve simultaneously a wide bandwidth of frequencies and high frequency resolution. Coherent indirect synthesis is based on phase-lock loop (PLL) principles in generating frequency increments through feedback control. This technique is limited in switching time to the time of the signal in the loop and is limited by the maximum bandwidth over which the loop can maintain frequency lock.

Many synthesizer currently in use are based on coherent direct synthesis. This may be based on analog or direct synthesis. The capabilities of these techniques are limited, however, as new communication requirements push the operating frequencies at higher and higher frequency bands and require faster, lighter, and more energy efficient synthesizers.

Microwave and millimeterwave components, such as mixers and multipliers, used in current synthesizers to achieve "bandwidth spreading", that is an increase in the bandwidth that can be covered by the frequency synthesizer, results in the generation of undesirable frequency spurs. These are normally eliminated by introducing filters at various stages of the frequency synthesis. If the filters are not in place, unsatisfactory system performance is likely. However, the presence of these filters imposes fundamental limits on switching speeds between frequencies which can be explained by the uncertainty principle. As an estimate, the time for a signal to propagate through a filter is approximately the inverse of its bandwidth, which puts limits on switching speeds. In addition, each mixer/filter or multiplier/filter stage introduces system losses which must be compensated by higher power inputs.

Much effort is being placed on GaAs MMIC technology to develop the compact and intricate circuitry required to apply coherent direct frequency synthesis to systems in the EHF frequency band. Important manufacturing problems must be resolved to make these techniques economically viable. In addition, filters are not easily integrated on active device chips based on GaAs. This leads to numerous interconnections and reproducibility problems with respect to system performance. Skilled technicians are therefore normally required to assemble, test and adjust these circuits leading to high fabrication and repair costs.

A recent advance in the art has been the development of Direct Digital Synthesis (DDS) which is based on the reconstruction of an output frequency from digitized look-up tables. This type of synthesizer has suffered principally from spurious outputs due to bit limitations for fast A/D convertors although clever means can reduce the level of these significantly. The other fundamental limitation of DDS is that the natural output of the synthesizer is limited to approximately half its operating clock frequency. This can be explained by the Nyquist sampling theorem. Present integrated circuit technology on which DDS depends is limited to operating clock frequencies in the order of 1 GHz. Thus to achieve a wide hopping spectrum based on DDS, a frequency expander section consisting of multipliers must be added to the unit which introduces limitations on switching speed, signal purity, part count and other factors as discussed earlier.

Another development that can be found in the prior art is the use of hybrid techniques which consist in combining two types of frequency synthesizers to form a complete system which hopefully combines the best of each type while minimizing their individual limitations. Indeed, the present invention could also be incorporated with other synthesizers. An example of such a system might be the combination of a DDS capable of providing excellent frequency resolution with a direct analog synthesizer capable of supplying only ten to one hundred frequencies separated by the frequency span covered by the DDS. In this case, the DDS provides the fine resolution while the direct analog synthesizer provides the wide bandwidth portion. Note that this requires additional complexity when compared to a single synthesizer and the system is limited by electronic considerations in bandwidth and switching speeds.

One of the simplest methods to introduce optical techniques to the art of frequency synthesis is to simply beat two lasers together. Essentially, the technique requires that the two lasers be tuned to frequency outputs very close together, usually by individual thermal adjustments to the lasers, although other techniques are possible. Their outputs are then beat against each other and the difference frequency is converted into an electrical signal. For the signal to be useable in a communications system, it is required either that the lasers have extremely narrow linewidths or that they somehow be phase-correlated. The former case requires expensive, highly stable lasers who are not usually compact. These lasers usually have a limited switching speed and limited frequency tunability. The latter requires that the lasers be phase locked, perhaps through a master-slave arrangement with a third laser. This type of technique has only been achieved over a relatively narrow bandwidth.

One might consider using external cavities with semiconductor lasers to narrow their linewidth but fundamental limits arise to the linewidth narrowing that can be achieved. In addition, the switching speed of the laser would be related to the external cavity return time, and hence the switching speed of the laser can be made too slow to use in a hopping system.

Finally, another consideration is that temperature and current gradients can affect each laser separately, which may result in an unstable system.

Yet another use of optical techniques found in the prior art is the use of optical components to replace microwave and millimeterwave components in the frequency expansion section of the frequency synthesizer. This type of utilization does not, however, result in important changes in the overall approach and virtually the same part count as in a completely electronic synthesizer results. In addition, optical components have a very limited efficiency as microwave component substitutes which may result in higher power requirements.

OBJECTS OF THE INVENTION

An object of the present invention is to provide a frequency synthesizer useful for frequency hopping over a frequency hopping bandwidth that is greater than that provided in the prior art.

Another object of the invention is to provide a frequency synthesizer useful for communication purposes and capable of frequency hopping at rates at least equal to or greater than that provided in the prior art.

Another object of the present invention is to provide a frequency synthesizer of relatively simple construction using optical techniques.

SUMMARY OF THE INVENTION

According to the present invention, there is provided an optically-based frequency synthesizer for generating an electric output signal at a preselected frequency having a given period that can be changed over a wide band of frequencies for communication purposes, comprising:

modulating means having an input for receiving a command signal corresponding to said preselected frequency, and an output for generating a current driving signal having a DC component, and a modulating component formed of an AC signal having a predetermined time period which is an integer multiple of the period of said preselected frequency, and an amplitude responsive to said command signal;

a laser having an input for receiving said current driving signal so that said laser is driven to emit a coherent light signal at at least two different wavelengths during the predetermined time period, said coherent light signal having a given coherence time;

optical isolating means for receiving said light signal emitted by said laser for preventing undesirable optical feedback into said laser;

an optical splitting device having an input optically connected to an output of said isolating means, and first and second outputs;

a first optical path having an end optically connected to the first output of said splitting device;

a second optical path having an end optically connected to the second output of said splitting device, and a delay means along its length for producing a time delay in light signal transmitted through said second path with respect to light signal transmitted through said first path, said time delay being shorter than said coherence time;

an optical recombining device having first and second inputs optically connected to other ends of said first and second paths respectively, so that said light signal transmitted through said first path can be beat with said light signal transmitted through said second path, said light signals transmitted through said paths having a frequency difference determined by said time delay;

a non-linear device having an input optically connected to an output of said recombining device, and an output for generating said electric output signal at said preselected frequency which corresponds to said frequency difference; and means for stabilizing operation of said synthesizer with respect to ambient temperature, whereby by applying said command signal to said modulating means, said output signal can be generated for communication purposes.

Also according to the present invention, there is provided an optically-based frequency synthesizer method for generating an electric output signal at a preselected frequency having a given period that can be changed over a wide band of frequencies for communication purposes, comprising steps of:

(a) modulating a command signal corresponding to said preselected frequency to generate a current driving signal having a DC component, and a modulating component formed of an AC signal having a predetermined time period which is an integer multiple of the period of said preselected frequency, and an amplitude responsive to said command signal;

(b) emitting a coherent light signal at at least two different wavelengths during the predetermined time period in response to said current driving signal produced in step (a), said coherent light signal having a given coherence time;

(c) coupling said light signal emitted in step (b) through light isolators;

(d) splitting said light signal coupled in step (c) into a first and second optical paths;

(e) delaying said light signal split into said second path with respect to said light signal split into said first path by a time delay that is shorter than said coherence time;

(f) recombining light signals exiting from said first and second paths so that said light signal transmitted through said first path can be beat with said light signal transmitted through said second path, said light signals transmitted through said paths having a frequency difference determined by said time delay;

(g) converting the light signals that have been combined in step (f) into said electric output signal at said preselected frequency which corresponds to a frequency difference between the light signals that have been recombined in step (f); and (h) stabilizing operation of said synthesizer with respect to ambient temperature, whereby, from reception of said command signal, said output signal can be generated for communication purposes.

The objects, advantages and other features of the present invention will become more apparent upon reading of the following non restrictive description of a preferred embodiment thereof, given for the purpose of exemplification only with reference to the accompanying drawings.

BRIEF DESCRIPTION OF THE DRAWINGS

FIG. 2 is a diagram illustrating the output wavelength of the semiconductor laser shown in FIG. 1 versus its bias current;

DETAILED DESCRIPTION OF PREFERRED EMBODIMENTS

Figure 1:
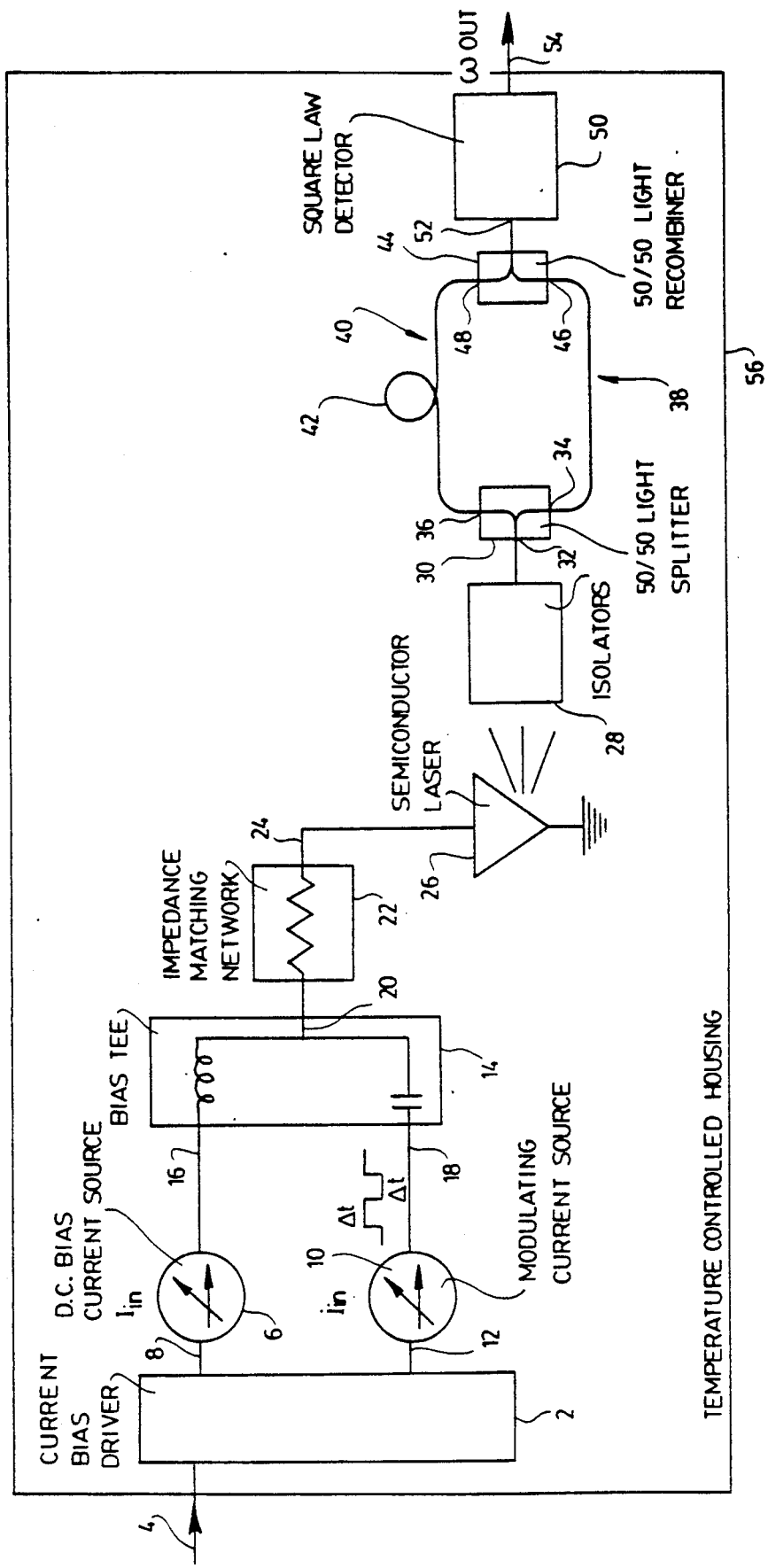
FIG. 1 is a schematic diagram illustrating an optically-based frequency synthesizer in accordance with the present invention.

Referring now to FIG. 1, there is shown an optically-based frequency synthesizer for generating an electric output signal at a preselected frequency having a given period that can be changed over a wide band of frequencies for communication purposes. The synthesizer comprises a modulator which is constituted of a current bias driver 2 having an input 4 for receiving a command signal corresponding to the preselected frequency; a DC bias current source 6 having an input 8 connected to an output of the current bias driver 2 for producing a DC component; a modulating current source 10 having an input 12 connected to another output of the current bias driver 2 for producing an AC signal having a predetermined time period which is an integer multiple of the period of the preselected frequency, and an amplitude responsive to the command signal; a bias tee 14 having inputs 16 and 18 connected respectively to outputs of the DC bias and modulating sources 6 and 10 for combining the DC component and the AC signal into an output 20; and an impedance matching network 22 having an input connected to the output 20 of the bias tee 14, and an output 24 for generating the current driving signal that is used to drive the semiconductor laser 26.

The laser 26 has an input for receiving the current driving signal so that it is driven to emit a coherent light signal at at least two different wavelengths during the predetermined time period. The coherent light signal has a given coherence time. Optical isolators 28 are provided for receiving the light signal emitted by the laser 26 to prevent undesirable optical feedback into the laser 26.

An optical splitting device 3.0 is provided. It has an input 32 optically connected to an output of the isolators 28, and first and second outputs 34 and 36. A first optical path 38 is provided. It has an end optically connected to the first output 34 of the splitting device 30. A second optical path 40 is also provided. It has an end optically connected to the second output 36 of the splitting device 30, an a delay means 42 along its length for producing a time delay in light signal transmitted through the second path 40 with respect to light signal transmitted through the first path 38, the time delay being shorter than the coherence time.

An optical combining device 44 is provided. It has first and second inputs 46 and 48 optically connected to the other end of the first and second paths 38 and 40 respectively so that the light signal transmitted through the first path can be beat with the light signal transmitted through the second path 40. The light signals transmitted through said paths 38 and 40 have a frequency difference determined by the time delay.

A non-linear device 50 is provided. It has an input 52 optically connected to an output of the recombining device 44, and an output 54 for generating the electric output signal at the preselected frequency which corresponds to the frequency difference.

Also, there is provided a means 56 for stabilizing operation of the synthesizer with respect to ambient temperature. This means for stabilizing is a temperature control housing 56. By applying the command signal to the modulator at the input 4, an output signal can be generated for communication purposes.

The AC signal that is produced by the modulating current source 10 has a 50% duty cycle, and a frequency of the order of 10 to 100 MHz.

The laser 26 is a two-lead distributed feedback laser 26. The optical isolators 28 are made of isolators providing substantially 60 dB of isolation. The laser 26 and the isolators 28 are incorporated into a single package. The output of the isolators 28 is made of an optical fibre that is part of the single package. The optical splitting device is substantially a 50:50 light splitter 30. The optical paths 38 and 40 are made of optical fibers. The delay means is produced by a loop 42 of predetermined length in the optical fiber of the second path 40. The time delay being determined by the following equation:

Time delay = 1/c where 1 is the predetermined length of the loop 42 and c is the speed of light in the second path 40. The recombining device 44 is substantially a 50:50 light recombiner 44.

The non-linear device 50 is a square law detector having a frequency response characterized by a time constant that allows only a conversion of the frequency difference into the output signal. The square law detector can be a photodiode.

With the synthesizer shown in FIG. 1, an optically-based frequency synthesizer method for generating an electric output at a preselected frequency that can be changed over a wide band of frequencies for communication purposes, can be performed.

This method comprises steps of (a) modulating a command signal corresponding to the preselected frequency to generate a current driving signal having a DC component, and a modulating component formed of an AC signal having a predetermined time period and an amplitude responsive to the command signal; (b) emitting a coherent light signal at at least two different wavelengths during the predetermined time period in response to the current driving signal produced in step (a), said coherent light signal having a given coherence time; (c) coupling the light signals emitted in step (b) through light isolators; (d) splitting the light signal coupled in step (c) into first and second optical paths; (e) delaying the light signal split into the second path with respect to the light signal split into the first path by a time delay that is shorter than the coherence time; (f) recombining light signals exiting from the first and second paths so that the light signal transmitted through the first path can be beat with the light signal transmitted through the second path, the light signals transmitted through the paths having a frequency difference determined by the time delay; (g) converting the light signals that have been combined in step (f) into the electric output signals at said preselected frequency which corresponds to a frequency difference between the light signals that have been recombined in step (f); and (h) stabilizing operation of the synthesizer with respect to ambient temperature, whereby, from reception of the command signal, said output signal can be generated for communication purposes.

The AC signal of the current driving signal produced in step (a) has a 50:50 duty cycle, and a frequency of the order of 10 to 100 MHz. The coupling of step (c) provides substantially 60 dB of isolation. The splitting of step (d) is a 50:50 splitting. The recombining of step (f) is a 50:50 recombining. The step (h) comprises a step of controlling temperature of a housing where is mounted the synthesizer.

Referring again to FIG. 1, wherein is shown an optically-based frequency synthesizer, the subject invention, which accepts input signals at input 4, corresponding to an output signal having the desired preselected frequency, and generates this output signal at output 54. The current bias driver 2 converts the input signals into amplitude levels for the very precise and stable DC bias current source 6 which generates $I_{in}$ and the modulating current source 10 which produces the current $i_{in}$. The current bias driver 2, the DC bias current source 6, and the modulating current source 10 include appropriate power sources.

Figure 8:
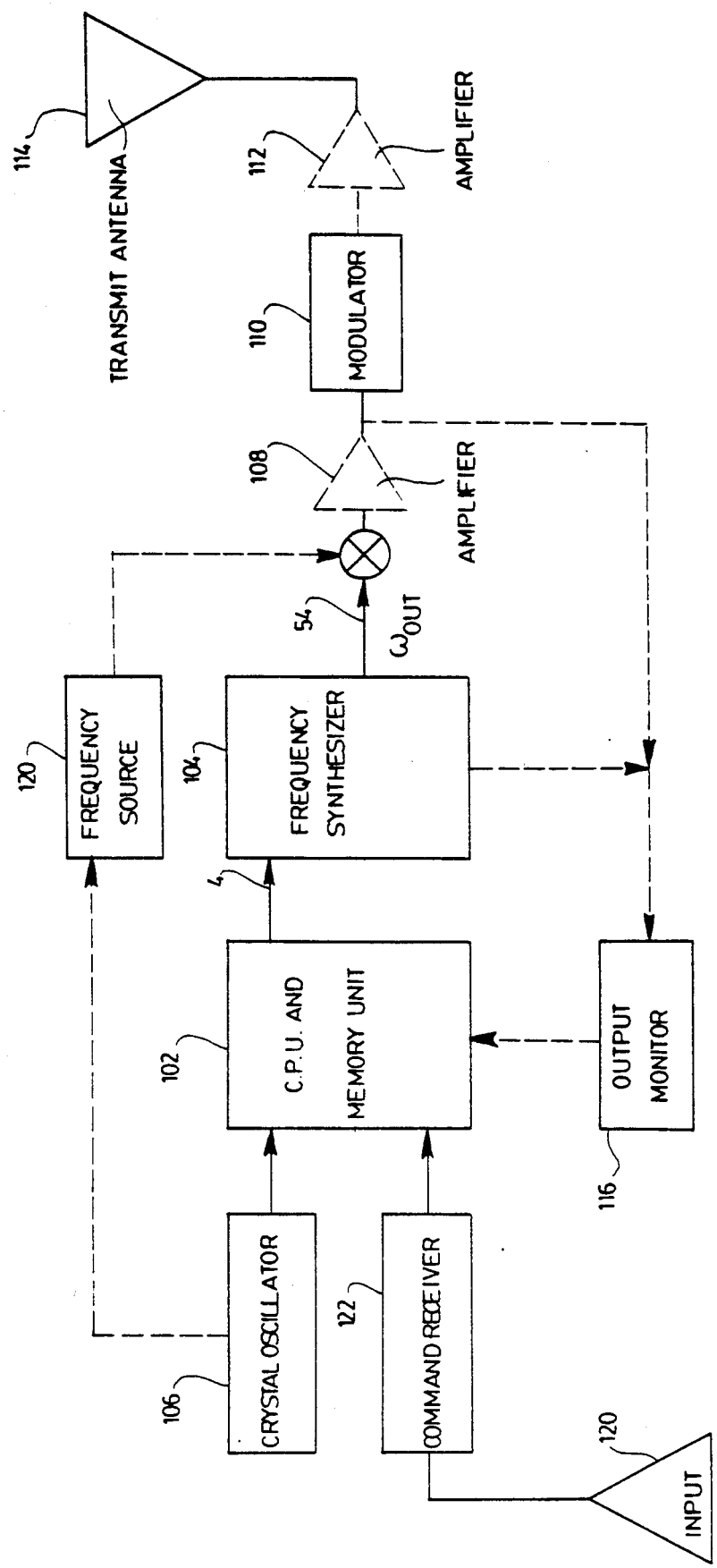
FIG. 8 is a block diagram illustrating an apparatus that can use as one of its parts an optically-based frequency synthesizer according to the present invention.

As will be seen in FIG. 8, the signal at input 4 could typically come from a computer processing unit 102 and take the form of a signal code establishing the bias current levels to achieve a given frequency difference at the output of the semiconductor laser 26, due to the difference in laser bias due to $i_{in}$. The DC current source 6 must be highly stable so as not to affect the modulation of the laser output signal. With similar considerations in mind, the current from this source will be set at a level to allow the operation of the laser in a linear if not nearly linear segment of its wavelength versus current curve to minimize problems which could arise from drifting from the original DC operating point. Clearly, should the DC current drift slightly from the operating point (i) shown in FIG. 2, the difference between slightly offset frequencies will be the same as opposed to the effect drift would have if the laser was operated at point (ii).

Referring again to FIG. 1, the modulating current source 10 is a square wave pulse train with a 50% duty cycle. The amplitude of the pulse is variable and set by the current bias driver 2. The period of this current pulse train is exactly twice the time difference Δt, achieved by the incorporation of the delay line 42 between the two optical paths 38 and 40 through which the output signal of the diode laser 26 will pass through. A bias tee 14 combines the two bias currents which are passed through the laser diode 26. The combined current output signal drives the semiconductor laser 26 through an impedance matching network 22. The period of the modulating signal need only be of the order of 10 to 100 MHz but as a square pulse function, it has significant harmonic content. Hence, it is important that the bias tee 14 can transmit high frequency signals and that the matching network 22 be well matched to the laser 26. An example of a suitable bias tee 14 is the Picosecond Pulse Laboratory model 5550B (trademark), although other bias tees can be used. The semiconductor laser 26 has a single mode output with a gain curve spanning the range of frequencies required to be generated for a given application.

Figure 7:
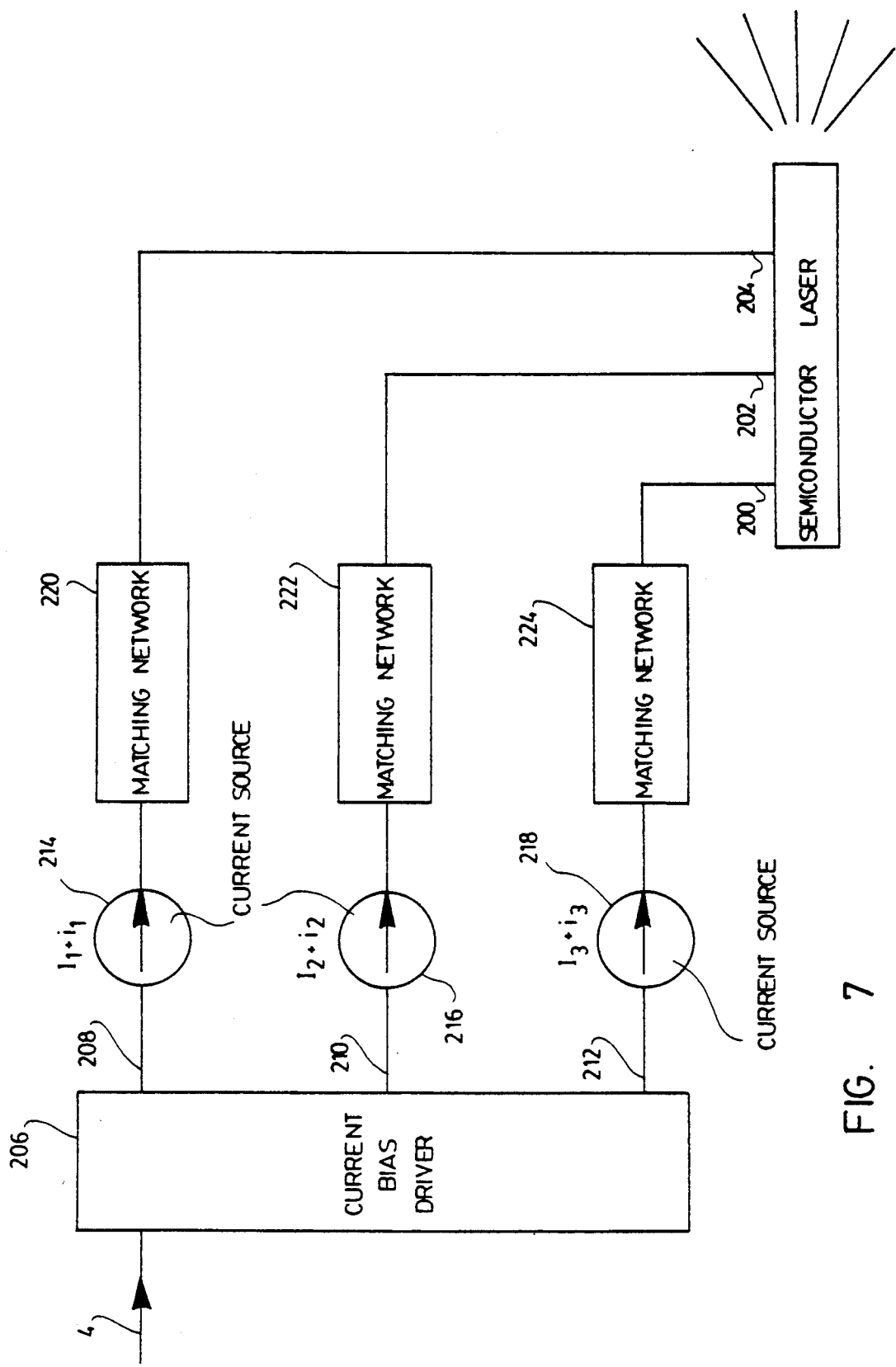
FIG. 7 is a block diagram illustrating an alternative embodiment of the modulating means in accordance with the present invention.

Referring now to FIG. 2, the laser diode 26 output can be expected for a flat FM transfer function laser to consist of two alternating wavelengths whose frequency difference $\omega_{out}$ will depend on both the DC operating point as determined by $I_{in}$ and the amplitude of the modulating current pulse train represented by $i_{in}$. It should be noted that the semiconductor laser need not be a single current bias device. Semiconductor lasers exist with two or three bias current leads, as shown in FIG. 7, which control different portions of the laser cavity. This results in the capability to independently control the wavelength, the amplitude, and phase of the laser output signal and extend the range over which the output wavelength can be varied while maintaining phase and single-mode laser stability. The configuration for the present synthesizer based on such a laser could be as shown in FIG. 7.

In this FIG. 7, there is shown a synthesizer wherein the modulator as three outputs 200, 202 and 204 for generating respectively three current driving signals. Each of the driving signals has a DC component, and a modulating component form of an AC signal having a predetermined time period and an amplitude responsive to the command signal. The modulator comprises a current bias driver 206 having the input 4 for receiving the command signal, and three outputs 208, 210 and 212; three DC bias and modulating current sources 214, 216 and 218 connected respectively to three outputs 208, 210 and 212 of the current bias driver 206; and three matching networks 220, 222 and 224 connected respectively to outputs of the three DC bias and modulating current sources 214, 216 and 218. Outputs of the three matching networks 220, 222 and 224 provide the three current driving signals. The laser has three inputs for receiving the three current driving signals at outputs 200, 202 and 204 of the modulator. As can be seen, the difference between this configuration and that shown in FIG. 1 is the added complexity in controlling the more numerous bias current levels. One important consideration in the utilization of a particular semiconductor diode is that the effective cavity return time be brief so that the wavelength of the laser can be changed very quickly. Another consideration is that the initial linewidth of the laser output be sufficiently narrow so that requirements on the current bias driver and modulating current source are not too severe.

Referring now to FIG. 1, the output of the semiconductor laser is then coupled into an optical fibre via optical isolators 28. Some commercial packages actually incorporate the latter into a single package with the semiconductor laser and are often suitably pig-tailed, that is coupled with an optical fibre which is also an intrinsic part of the package. The isolators 28 which should provide at least 60 dB of isolation, are necessary to prevent back reflections from affecting the stability and output of the laser. The optical fibers and other fiber components such as the coupling fibers, delay line 42, light splitter 30, and light recombiner 44 should be oriented to maximize coupling into the fiber couplers, which can act as light splitters or recombiners, can therefore be of the polarization maintaining type. These are commercially available.

In this case, the orientation of the input fiber into which the laser output is coupled, would be properly aligned to maximize laser coupling efficiency. It is to be noted, however, that polarization maintaining fibers are not strictly required as the lengths of all the fiber components are relatively short, including that of the delay line, so that the polarization of light into a fiber is likely to be maintained. The critical point is that the polarization of each light beam to be recombined by the recombiner 44 be the same. This is required as the square law detector 50 effectively generates a beat frequency from the components of light of the same polarization from the overlapping beams.

Figures 3A, 3B, 3C:
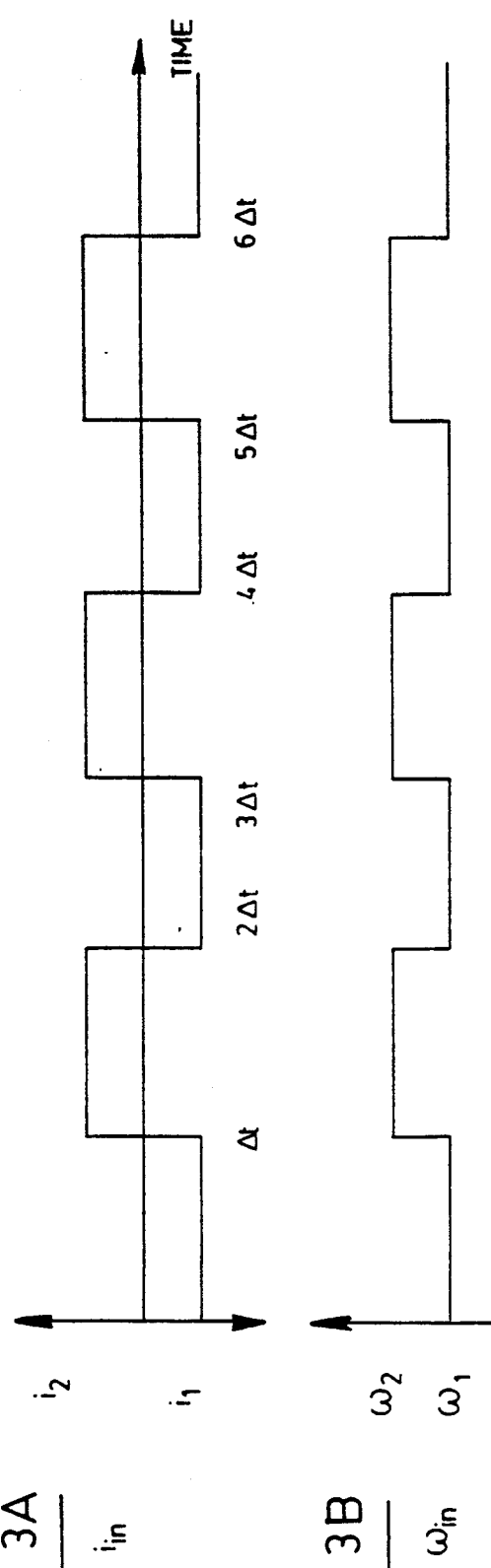
FIGS. 3A, 3B and 3C are diagrams of exemplary signals illustrating respectively the modulating driving current, the output signal of the laser and the output signal of the synthesizer, with respect to time.
Figure 6:
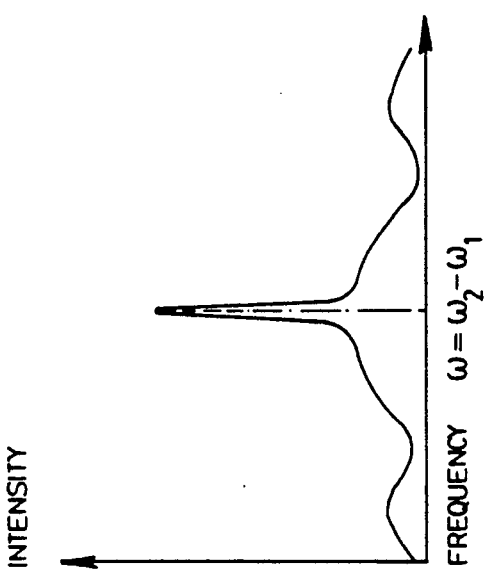
FIG. 6 is a diagram illustrating the intensity of the electric signal at the output of the square law detector shown in FIG. 1 with respect to frequency, where the time delay introduced in the second optical path shown in FIG. 1 is much smaller than the coherence time of the light signal generated by the laser.
Figure 5:
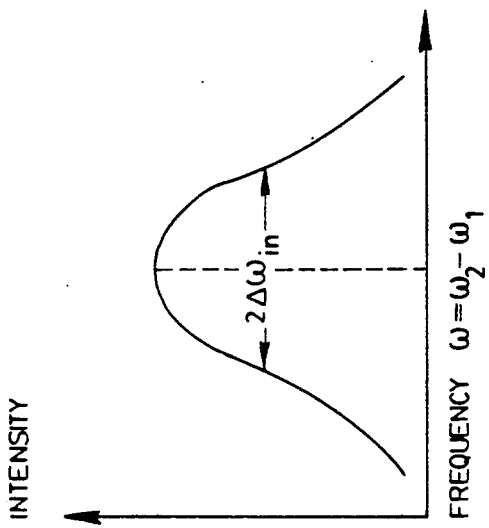
FIG. 5 is a diagram illustrating the intensity of the electric signal at the output of the square law detector shown in FIG. 1 with respect to frequency, where the time delay introduced in the second optical path shown in FIG. 1 is much greater than the coherence time of the light signal generated by the laser.
Figure 4:
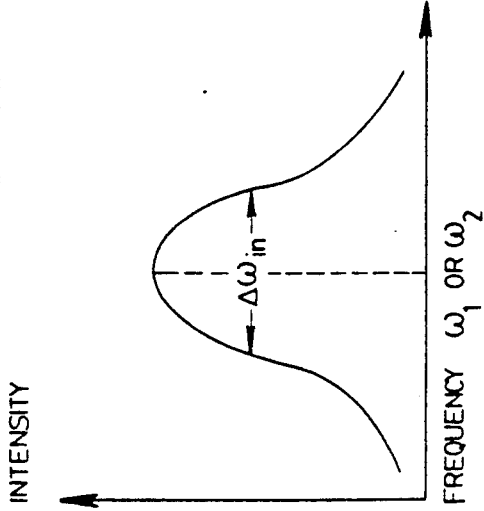
FIG. 4 is a diagram illustrating the intensity of the light signal at the output of the laser shown in FIG. 1 with respect to frequency, where $\Delta\omega_{in}$ is the linewidth of the laser.

The length, l, of the delay line 42 is such that the delay time is $\Delta t$ where $\Delta t = 1/c$, and c is the speed of light in the path medium. As shown in FIGS. 3A, 3B and 3C, this results a constant frequency at output 54 with the laser output at one wavelength, say $\omega_1$ beating with the laser output of the same laser generated $\Delta t$ later, but at $\omega_2$, and vice versa, due to the bias current modulation imposed by $i_{in}$. The time delay, $\Delta t$, is set to be shorter than the coherence time of the laser, $\tau_c$, a key aspect of the present invention. This is because the linewidth of semiconductor lasers is typically 100,000 kHz to 100 MHz. For a frequency output to be useful, the output requires a linewidth typically not wider than 100 Hz to 10 kHz. As shown in FIGS. 4, 5 and 6, if the delay time of the delay path is much larger than the coherence time of the laser, the beat signal generated will have a linewidth actually broader than that of the laser output, as the situation becomes equivalent to beating two non correlated lasers together. However, if the delay time is shorter than the coherence time of the laser, the two outputs, which originate from the same laser, are partially coherent. This results in a narrow beat frequency peak in the output spectrum, as can be seen in FIG. 6. The output can therefore be made to be suitable for communication purposes. Since the ratio of the power in this narrow peak to the power in the remaining portions of the spectrum is roughly proportional to $e^{-\Delta t/\tau c}$, the original semiconductor laser linewidth must be sufficiently narrow to obtain a reasonable power level of the beat frequency. This equation is an approximation as the exact linewidth reduction achieved through coherent noise cancellation is dependent on the exact shape of the frequency output of the laser.

Referring now to FIG. 1, the square law detector 50 can be a photodiode with supporting bias circuitry, filters and power. Experimental photodiodes will convert signals at up to 100 GHz. The combined light incident on the photosensitive surface of the photodiode can be expressed as a combination of two oscillating components, one component oscillating at the difference frequency $\omega_{out} = \omega_1 - \omega_2$, and another component oscillating at the sum frequency, $\omega_1 + \omega_2$. Due to limits in the time constant of the response of the photodiode, only the difference frequency is converted into an electrical output signal which is generated at the output 54.

A temperature controlled housing 56 serves to prevent external environmental factors from disrupting the proper functioning of the invention. This aspect cannot be neglected as the change with temperature in output frequency for a semiconductor laser may be as high as 30–40 GHz per degree Celsius. Similarly, the change in lasing frequency with bias current may be of the order of many GHz per mA depending on the DC operating point.

It is worth noting that it is an accepted fact that the lasing wavelength of a semiconductor laser can be varied over several hundreds of GHz by changing the bias current flowing through it. It is also well known that partial coherency leads to linewidth reduction when the output of a laser is beat against itself. It is the new combination of these factors in the configuration of the present invention and the realization that coherence is maintained despite bias current modulation to the laser which cause the invention to be effected and which, in turn, cause the above indicated new and improved results to be produced thereby.

The concept that the coherence in the output of the laser is maintained despite its wavelength being modulated is a key aspect of the present invention. The change in the laser bias results in a change in electron concentrations in the cavity and thus results in a change in the index of refraction within the cavity. This can be regarded as a change in the effective length of the cavity and as causing photons within the cavity to undergo a Doppler shift. Nevertheless, these photons, which drive the stimulated emission giving rise to a coherent laser output, are the same photons and are therefore coherent with each other as they were before a change in current bias.

As an aid to the general understanding of the subject invention, consider its application in a typical system that depends on the generation of fast hopping frequency outputs. such an application is shown in FIG. 8 with options indicated by dotted lines. The block diagram could represent a low probability intercept communications link from a satellite based on a fast hopping wideband EHF or UHF frequency synthesizer. While the transmit link is shown, it is clear that the subject invention could be incorporated in a similar manner in a receive link, either on the satellite or on the ground.

The CPU and memory unit 102 is the subsystem of the communication link which would control the output of the synthesizer 104. At a minimum, unit 102 would be a hardware-based frequency selector receiving an input signal by means of input 120 and command receiver 122. As shown in FIG. 8, the unit 102 is a programmable CPU with memory to access programmed frequency selections and which is capable of receiving instructions from a command receiver to allow for external control of the system. The unit 102, based on its programming, sends the required signal at input 4 to generate a signal at output 54. The timing of the output of the unit 102 is guided by the clock input from the crystal oscillator 106. The signal at the output 54 may be amplified by the amplifier 108 before the data to be transmitted is added to this output by the modulator 110. A second possible point of signal amplification is by means of the amplifier 112 before the signal is transmitted via the transmit antenna 114. The output monitor 116 could be incorporated to monitor the performance of the synthesizer 104 by monitoring the electrical signal from output 54 or optical outputs within the subject invention. These could be incorporated into the design by using low power fibre optic taps, such as 95/5 couplers, to obtain an output that can be monitored without disrupting the operation of the synthesizer.

The final option that is included in FIG. 8 is a separate frequency source 120. In some applications, it may be more appropriate to use the subject invention to provide only large incremental steps in frequency. The frequency source could then be a DDS subsystem, for example, providing the small hopping steps mixed either optically or, as shown in the FIG. 8, electrically with the output 56. Another possibility would be for the frequency source 120 to be a highly stable oscillator of fixed frequency determining the frequency band of operation for the communication link. The present invention would provide the frequency hopping capability of the system over its bandwidth of operation. Its output signal would be mixed as shown in FIG. 8. Both these options offer a system based on a hybrid including the present invention.

Obviously, many modifications and variations of the present invention are possible in light of the above teachings. For example, while the modulation on the laser current bias has been described as a square wave current input whose period is equal to twice the time delay between the two laser outputs to be beat against each other, the modulation could be a current ramp providing a linear change in laser output wavelength with time during the duration of the ramp. This would also result in a constant frequency output dependent on the rate of change as set by the ramp. Another variation would be to utilize a rectangular wave whose duty cycle is not 50:50. This would result in the capacity to transmit frequency of varying duration based on the fact that the possibility that the difference frequency generated by the beating of the two laser outputs would be zero Hertz or DC for at least part of the duty cycle. Yet another variation would be to modulate the length of an external cavity of a laser, as opposed to direct current bias modulation, perhaps by modulating an electro-optic component in the cavity path.

It is therefore to be understood that within the scope of the disclosed inventive concept, the invention may be practised otherwise than specifically described.

We claim:

1. An optically-based frequency synthesizer for generating an electric output signal at a preselected frequency having a given period that can be changed over a wide band of frequencies for communication purposes, comprising:

modulating means having an input for receiving a command signal corresponding to said preselected frequency, and an output for generating a current driving signal having a DC component, and a modulating component formed of an AC signal having a predetermined time period which is an integer multiple of the period of said preselected frequency, and an amplitude responsive to said command signal;

a laser having an input for receiving said current driving signal so that said laser is driven to emit a coherent light signal at at least two different wavelengths during the predetermined time period, said coherent light signal having a given coherence time;

optical isolating means for receiving said light signal emitted by said laser for preventing undesirable optical feedback into said laser;

an optical splitting device having an input optically connected to an output of said isolating means, and first and second outputs;

a first optical path having an end optically connected to the first output of said splitting device;

a second optical path having an end optically connected to the second output of said splitting device, and a delay means along its length for producing a time delay in light signal transmitted through said second path with respect to light signal transmitted through said first path, said time delay being shorter than said coherence time;

an optical recombining device having first and second inputs optically connected to other ends of said first and second paths respectively, so that said light signal transmitted through said first path can be beat with said light signal transmitted through said second path, said light signals transmitted through said paths having a frequency difference determined by said time delay;

a non-linear device having an input optically connected to an output of said recombining device, and an output for generating said electric output signal at said preselected frequency which corresponds to said frequency difference; and means for stabilizing operation of said synthesizer with respect to ambient temperature, whereby by applying said command signal to said modulating means, said output signal can be generated for communication purposes.

2. A synthesizer according to claim 1, wherein said means for stabilizing is a temperature controlled housing.

3. A synthesizer according to claim 2, wherein said modulating means comprises:
a current bias driver having said input for receiving said command signal;
a DC bias current source having an input connected to an output of said current bias driver, for producing said DC component;
a modulating current source having an input connected to another output of said current bias driver, for producing said AC signal;
a bias tee having inputs connected respectively to outputs of said DC bias and modulating sources for combining said DC component and said AC signal into an output; and
an impedance matching network having an input connected to the output of said bias tee, and an output for generating said current driving signal.

4. A synthesizer according to claim 3, wherein said AC signal that is produced by said modulating current source has a fifty percent duty cycle, and a frequency of the order of 10 to 100 MHz.

5. A synthesizer according to claim 4, wherein said laser is a semiconductor laser.

6. A synthesizer according to claim 4, wherein said laser is a two-lead distributed feedback laser.

7. A synthesizer according to claim 4, wherein said optical isolating means is made of isolators providing substantially 60 dB of isolation.

8. A synthesizer according to claim 7, wherein said laser and said isolators are incorporated into a single package, and wherein said output of said isolating means is made of an optical fiber that is a part of said single package.

9. A synthesizer according to claim 8, wherein said optical splitting device is substantially a 50:50 light splitter.

10. A synthesizer according to claim 9, wherein said optical paths are made of optical fibers, and said delay means is produced by a loop of predetermined length in the optical fiber of said second path, said time delay being determined by the following equation:

$$\text{time delay} = l/c$$

where l is the predetermined length of said loop and c is the speed of light in said second path.

11. A synthesizer according to claim 10, wherein said recombining device is substantially a 50:50 light recombiner.

12. A synthesizer according to claim 11, wherein said non-linear device is a square law detector having a frequency response characterized by a time constant that allows only a conversion of said frequency difference into said output signal.

13. A synthesizer according to claim 12, wherein said square law detector is a photodiode.

14. A synthesizer according to claim 1, wherein said modulating means has two additional outputs for generating respectively two additional current driving signals, each of said additional signals having a DC component, and a modulating component formed of an AC signal having a predetermined time period which is an integer multiple of the period of said preselected frequency, and an amplitude responsive to said command signal, said modulating means comprising:
a current bias driver having said input for receiving said command signal, and three outputs;
three DC bias and modulating current sources connected respectively to said three outputs of said current bias driver; and
three matching networks connected respectively to outputs of said three DC bias and modulating current sources, outputs of said three matching networks providing said three current driving signals; and wherein said laser has two additional inputs for receiving said three current driving signals.

15. An optically-based frequency synthesizer method for generating an electric output signal at a preselected frequency having a given period that can be changed over a wide band of frequencies for communication purposes, comprising steps of:
(a) modulating a command signal corresponding to said preselected frequency to generate a current driving signal having a DC component, and a modulating component formed of an AC signal having a predetermined time period which is an integer multiple of the period of said preselected frequency, and an amplitude responsive to said command signal;
(b) emitting a coherent light signal at at least two different wavelengths during the predetermined time period in response to said current driving signal produced in step (a), said coherent light signal having a given coherence time;
(c) coupling said light signal emitted in step (b) through light isolators;
(d) splitting said light signal coupled in step (c) into first and second optical paths;
(e) delaying said light signal split into said second path with respect to said light signal split into said first path by a time delay that is shorter than said coherence time;
(f) recombining light signals exiting from said first and second paths so that said light signal transmitted through said first path can be beat with said light signal transmitted through said second path, said light signals transmitted through said paths having a frequency difference determined by said time delay;
(g) converting the light signals that have been combined in step (f) into said electric output signal at said preselected frequency which corresponds to a frequency difference between the light signals that have been recombined in step (f); and (h) stabilizing operation of said synthesizer with respect to ambient temperature, whereby, from reception of said command signal, said output signal can be generated for communication purposes.

16. A method according to claim 15, wherein the AC signal of said current driving signal produced in step (a) has a fifty percent duty cycle, and a frequency of the order of 10 to 100 Mhz.

17. A method according to claim 15, wherein said coupling of step (c) provides substantially 60 dB of isolation.

18. A method according to step 16, wherein said splitting of step (d) is a 50:50 splitting.

19. A method according to step 17, wherein said recombining of step (f) is a 50:50 recombining.

20. A method according to claim 15, wherein said step (h) comprises a step of controlling temperature of a housing where is mounted said synthesizer.

* * * * *